(12) United States Patent
Zhou et al.

(10) Patent No.: US 10,819,277 B2
(45) Date of Patent: Oct. 27, 2020

(54) OSCILLATOR CIRCUIT

(71) Applicant: Stichting IMEC Nederland, Eindhoven (NL)

(72) Inventors: Cui Zhou, Eindhoven (NL); Paul Mateman, Millingen a/d Rijn (NL)

(73) Assignee: STITCHING IMEC NEDERLAND, Eindhoven (NL)

( * ) Notice: Subject to any disclaimer, the term of this patent is extended or adjusted under 35 U.S.C. 154(b) by 0 days.

(21) Appl. No.: 16/527,471

(22) Filed: Jul. 31, 2019

(65) Prior Publication Data

US 2020/0044603 A1 Feb. 6, 2020

(30) Foreign Application Priority Data

Jul. 31, 2018 (EP) .................... 18186500

(51) Int. Cl.
*H03K 3/282* (2006.01)
*H03B 5/12* (2006.01)

(52) U.S. Cl.
CPC ..... *H03B 5/1212* (2013.01); *H03B 2200/004* (2013.01)

(58) Field of Classification Search
CPC ................ H03B 5/1212; H03B 2200/004
USPC ................ 331/117 R, 117 FE, 167
See application file for complete search history.

(56) References Cited

U.S. PATENT DOCUMENTS

| 9,425,737 B1 | 8/2016 | Bushman et al. |
| 2009/0189704 A1 | 7/2009 | Li |
| 2011/0273239 A1* | 11/2011 | Lee .................. H03B 5/1221 331/117 FE |
| 2014/0266342 A1* | 9/2014 | Arai .................. H03L 7/099 327/156 |
| 2016/0099679 A1 | 4/2016 | Babaie et al. |
| 2016/0099681 A1 | 4/2016 | Zong et al. |
| 2018/0175796 A1 | 6/2018 | Park et al. |

FOREIGN PATENT DOCUMENTS

WO 2010/042447 A2 4/2010

OTHER PUBLICATIONS

European Search Report, European Patent Application No. 18186500.7, dated Jan. 24, 2019, 10 pages.

Bender, C., "Capacitive Ladder Networks", IEEE Transactions on Circuits and Systems: I: Fundamental Theory and Applications, vol. 41, No. 8, Aug. 1994, pp. 557-558.

Chen J. et al., "A Low-Voltage High-Swing Colpitts VCO With Inherent Tapped Capacitors Based Dynamic Body Bias Technique", 2017 IEEE International Symposium on Circuits and Systems, May 28, 2017, pp. 1-4.

(Continued)

*Primary Examiner* — Richard Tan
(74) *Attorney, Agent, or Firm* — McDonnell Boehnen Hulbert & Berghoff LLP

(57) ABSTRACT

A differential Colpitts oscillator circuit is described which provides a larger tuning range, has better phase noise and uses less power than conventional differential Colpitts oscillator circuits. The circuit is characterized by a capacitive ladder in which only variable capacitor is used for tuning the circuit. In some embodiments, a variable capacitor can be used for fine tuning.

7 Claims, 9 Drawing Sheets

(56) References Cited

OTHER PUBLICATIONS

Hossain, Masum et al., "20 GHz Low Power QVCO and De-skew Techniques in 0.13um Digital CMOS", IEEE 2008 Custom Integrated Circuits Conference (CICC), 2008, pp. 447-450.

Jain, Sanjeev et al., "A 4.0/7.5-GHz Dual-Band LC VCO in 0.18-um SiGe BiCMOS Technology", 2013 International Symposium on VLSI Design, Automation, and Test (VLSI-DAT), IEEE, pp. 1-4.

Nguyen, Tai Nghia et al., "A K-Band CMOS Differential Vackar VCO With the Gate Inductive Feedback", IEEE Transactions on Circuits and Systems—II: Express Briefs, vol. 59, No. 5, May 2012, pp. 257-261.

Aparicio, Roberto et al., "A Noise-Shifting Differential Colpitts VCO", IEEE Journal of Solid-State Circuits, vol. 37, No. 12, Dec. 2002, pp. 1728-1736.

Sun, Junyi et al., "A Low-Power Low-Phase-Noise VCO With Self-Adjusted Active Resistor", IEEE Microwave and Wireless Components, vol. 26, No. 3, Mar. 2016, pp. 201-203.

Hsu, M.T. et al., "Low Power Design of CMOS 5-GHz Voltage-Controlled Oscillator From Narrowband to Wideband with Switching Capacitor Module", IET Circuits, Devices & Systems, vol. 3, Issue. 3, 2009, pp. 99-105.

Esswein, Alexander et al., "A Low Phase-Noise SiGe Colpitts VCO With Wide Tuning Range for UWB Applications", Proceedings of the 3rd European Wireless Technology Conference, Sep. 27-28, 2010, Paris France, pp. 229-232.

Cheng, Kuang-Wei et al., "A Current-Switching and gm-Enhanced Colpitts Quadrature VCO", IEEE Microwave and Wireless Components Letters, vol. 23, No. 3, Mar. 2013, pp. 143-145.

Kim, Joo-Myoung et al., "A 0.5V, 2.41GHz, 196.3dBc/Hz FoM Differential Colpitts VCO With an Output Voltage Swing Exceeding Supply and Ground Potential Requiring No Additional Inductor", 2013 IEEE Radio Frequency Integrated Circuits Symposium, 2013, pp. 39-42.

Shahmohammadi, Mina et al., "Tuning Range Extension of a Transformer-Based Oscillator Through Common-Mode Colpitts Resonance", IEEE Transactions on Circuits and Systems—I: Regular Papers, vol. 64, No. 4, Apr. 2017, pp. 836-846.

European Search Report, European Patent Application No. 18186506.4, dated Jan. 25, 2019, 9 pages.

Hong, J. et al., "Low Phase Noise Gm-Boosted Differential Colpitts VCO With Suppressed AM-to-FM Conversion," 2009 IEEE Radio Frequency Integrated Circuits Symposium, 2009, pp. 255-258.

Hong, J., "A Low Supply Voltage and Wide-Tuned CMOS Colpitts VCO," IEICE Electronics Express, vol. 11, No. 13, pp. 1-6.

Ji, X. et al., "Current Reused Colpitts VCO and Frequency Divider With Quadrature Outputs," IEICE Electronics Express, vol. 8, No. 4, pp. 239-244.

Oh, N., High Performance Differential Colpitts VCO With a Linearized Tuning Range Using a Series Resonator, IEICE Electronics Express, vol. 11, No. 14, pp. 1-5.

* cited by examiner

OSCILLATOR CIRCUIT

CROSS-REFERENCE TO RELATED APPLICATIONS

The present application is a non-provisional patent application claiming priority to European Patent Application No. 18186500.7, filed on Jul. 31, 2018, the contents of which are hereby incorporated by reference.

FIELD OF THE DISCLOSURE

The present disclosure relates to Colpitts oscillators and is more particularly concerned with providing an extended tuning range for such oscillators.

BACKGROUND

Switched resonator oscillators, transformer-based oscillators and mode-switching oscillators are widely implemented in phase-locked loop (PLL) circuits which are widely used for many applications including multi-mode, multi-band applications. However, while it is possible to improve the phase noise and tuning range trade-off using such oscillators, there is generally no improvement in the trade-off between tuning range and die area.

Noise-shifting differential Colpitts voltage-controlled oscillators (VCOs) have been proposed by Roberto Aparicio et al. in "A Noise-Shifting Differential Colpitts VCO" (IEEE Journal of Solid-State Circuits, Vol., 37, No, 12, December 2002), referred to hereinafter as "Aparicio et al.", in which current switching is used to lower phase noise and improve the start-up condition. The oscillator topology utilizes cyclostationary noise alignment while providing a fully differential output and a large loop gain for reliable start-up. Two identical Colpitts oscillators are coupled together so that they share their source-to-ground capacitors. The center node forms a differential virtual ground and is left floating with the operation of each oscillator remaining unchanged when each side oscillates 180° out of phase.

A low-voltage differential Colpitts VCO is described in "A 0.5V, 2.41 GHz, 196.3 dBc/Hz FoM Differential Colpitts VCO with an Output Voltage Swing Exceeding Supply and Ground Potential Requiring No Additional Inductor" (Joo-Myoung Kim et al., 2013 IEEE Radio Frequency Integrated Circuits Symposium, 978-1-4673-6062-3/13), referred to hereinafter as "Kim et al.", in which a differential Colpitts oscillator with low phase noise and small chip area is proposed. Enhanced output voltage swing is obtained above the supply voltage and below the ground potential by the combination of the differential output at the gate nodes of feedback transistors and capacitive dividers without requiring an additional inductor.

While Aparicio et al. and Kim et al. describe circuits that reduce phase noise, increased tuning range is not addressed. In the article "Tuning Range Extension of a Transformer-Based Oscillator through Common-Mode Colpitts Resonance" by Mina Shahmohammadi et al. (IEEE Transactions on Circuits and Systems—1: Regular Papers, Volume 64, No. 4, April 2017), referred to hereinafter as "Shahmohammadi et al.", a method of extending a tuning range of a CMOS LC-tank oscillator is described without sacrificing its area. The extra tuning range is obtained by forcing a strongly coupled transformer-based tank into a common-mode resonance at a much higher frequency than its main differential-mode oscillation. Four inductors are coupled through four switching transistors to form two separate active circuits, sharing the same tank. The transformer-based tank is forced to oscillate either in a differential mode or a common mode. The tank is forced into common-mode oscillation by two injection locked Colpitts oscillators at the primary winding of the transformer while a two-port structure provides differential-mode oscillation. The oscillator is switched between resonant modes.

Although tuning range can be extended in the circuit described by Shahmohammadi et al., phase noise in the common mode of the oscillator circuit is generally not improved.

There is therefore a need to provide an oscillator circuit which has both extended tuning range and reduced phase noise.

In addition, there is a need to maintain a positive feedback voltage while tuning the oscillation frequency of the oscillator circuit so that oscillation is maintained after start-up.

SUMMARY

It is a potential benefit of the present disclosure to provide an improved differential Colpitts oscillator circuit which provides extended tuning range without reduced noise performance.

It is another potential benefit of the present disclosure to provide an improved differential Colpitts oscillator that maintains a positive feedback voltage while tuning the oscillation frequency of the oscillator circuit.

In accordance with one aspect of the present disclosure, there is provided a differential Colpitts oscillator circuit comprising: a first transistor pair having a first tap point therebetween; a first power supply connected to a first transistor of the first transistor pair; a first inductor connected in a first line between a gate of the first transistor of the first transistor pair and a connecting point; a second transistor pair having a second tap point therebetween; a second power supply connected to a first transistor of the second transistor pair; a second inductor connected in a second line between a gate of the first transistor of the second transistor pair and the connecting point; a first variable capacitor connected in a third line between the first and second tap points; and a resistor connected to a second transistor of the first transistor pair and to a second transistor of the second transistor pair, the resistor also being connected to a ground point; characterized in that the differential Colpitts oscillator circuit comprises a capacitive ladder connected between the third line and each of the first and second lines; and in that the first variable capacitor forms part of the capacitive ladder.

By having a capacitive ladder within the differential Colpitts oscillator circuit of the present disclosure, it is possible to increase the oscillation frequency range without compromising phase noise performance, area, or power.

The capacitive ladder may comprise at least a first pair of capacitors connected between the first line and the third line, at least a second pair of capacitors connected between the second line and the third line, and a second variable capacitor connected between the first and second pairs of capacitors at respective intermediate points.

Such an arrangement enables both extension of tuning range by tuning the second variable capacitor and fine tuning of the oscillator circuit using the first variable capacitor.

In an embodiment, the gate of the second transistor of the second transistor pair is connected to a center-tap point of the first inductor and the gate of the second transistor of the first transistor pair is connected to a center-tap point of the second inductor.

By having this cross-coupling between the second transistors of the first and second transistor pairs and the first and second inductors, the supply voltage can be substantially reduced so that voltage swings do not damage the transistors.

In accordance with another aspect of the present disclosure, there is provided a method of increasing the tuning range of a differential Colpitts oscillator circuit as described above, the method comprising tuning the second variable capacitor to increase the tuning range of the oscillator circuit.

By tuning only the second variable capacitor, there is generally less impact on the feedback voltage for the oscillator.

The method may further comprise using the first variable capacitor to provide fine-tuning of the oscillator circuit.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1:
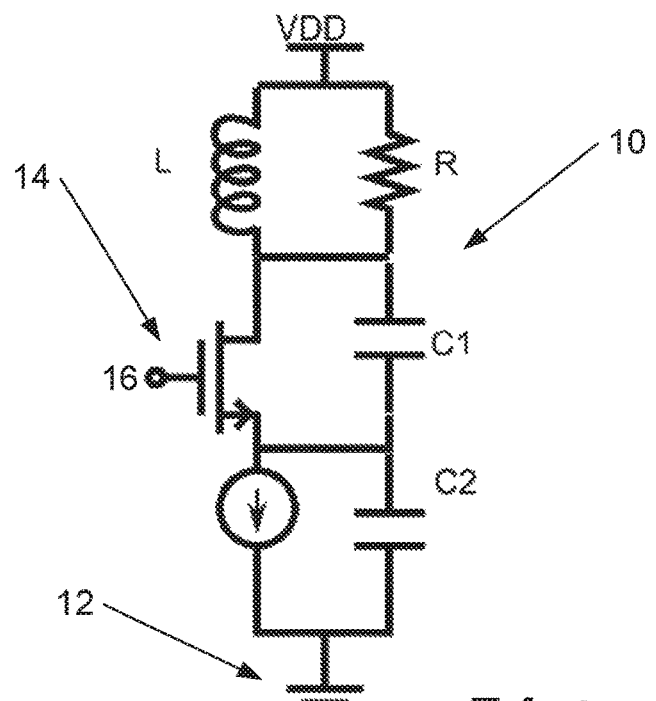
FIG. 1 is a schematic illustration of a conventional single-ended Colpitts oscillator circuit, according to an example embodiment.

A conventional single-ended Colpitts oscillator circuit 10 is shown in FIG. 1 and comprises first and second capacitors C1, C2, a resistor R, and an inductor L connected between a supply voltage VDD and ground 12. A transistor 14 is provided for applying a bias 16 to the circuit 10. A capacitive voltage divider is formed by the first and second capacitors C1 and C2 which provides a positive feedback path. The inductor L and the capacitive voltage divider formed by the first and second capacitors C1 and C2 together form an oscillation tank.

The single-ended Colpitts oscillator circuit 10 generally has lower phase noise than most other oscillator topologies or circuits and its use is common in implementations where phase noise is an issue. However, the circuit 10 is typically sensitive to single-ended parasitics.

Figure 2:
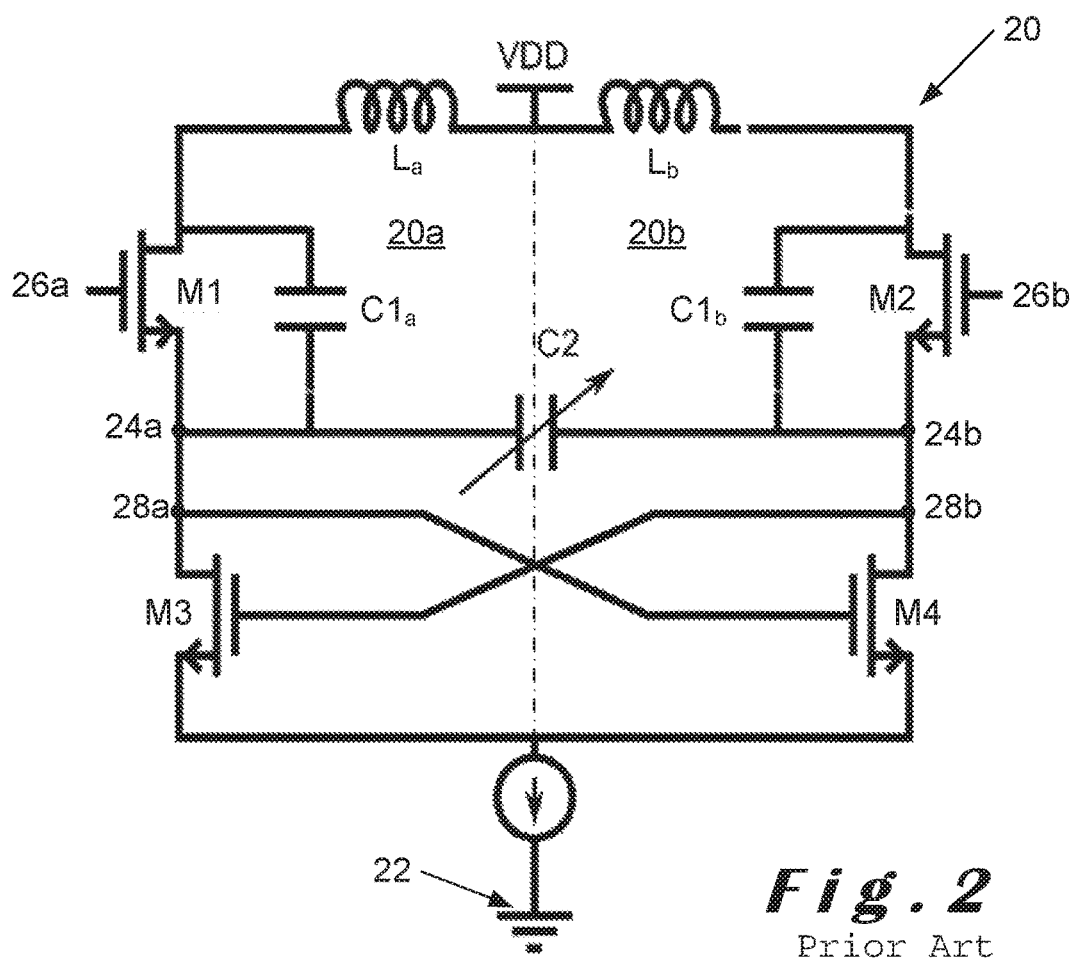
FIG. 2 is a schematic illustration of a conventional differential Colpitts oscillator circuit, according to an example embodiment.

FIG. 2 is a schematic illustration of a conventional differential Colpitts oscillator circuit 20. The circuit 20 can be considered to comprise two portions 20a, 20b corresponding to two identical single-ended Colpitts oscillators which are joined by a variable or tunable capacitor C2 at center-tap points 24a, 24b with cross-connections between transistors as described below.

Portion 20a comprises transistors M1 and M3 where transistor M1 corresponds to transistor 14 in FIG. 1. A bias 26a is applied to transistor M1. As shown, a capacitor $C1_a$ is positioned across transistor M1 and is connected to the line joining center-tap points 24a, 24b containing the variable or tunable capacitor C2. Inductor $L_a$ is connected to power supply VDD and to transistor M1. Transistor M3 is connected to ground 22.

Similarly, portion 20b comprises transistors M2 and M4 where transistor M2 corresponds to transistor 14 in FIG. 1. A bias 26b is applied to transistor M2. As shown, a capacitor $C1_b$ is positioned across transistor M2 and is connected to the line joining center-tap points 24a, 24b containing the variable or tunable capacitor C2. Inductor $L_b$ is connected to power supply VDD and to transistor M2. Transistor M4 is connected to ground 22.

The center-tap points 24a, 24b are located between respective ones of the transistor pairs M1, M3 and M2, M4. The variable or tunable capacitor C2 is connected to a line joining the center-tap points 24a, 24b.

Connections are provided between the respective transistor pairs M1, M3 and M2, M4 and respective gates of transistor M4 and transistor M3 as shown. The connections are made at points 28a and 28b with respect to respective ones of the transistor pairs M1, M3 and M2, M4. A differential output is provided by coupling the two portions 20a, 20b by sharing variable or tunable capacitor C2.

The differential Colpitts oscillator circuit 20 has the potential advantage of having low phase noise which is the same as the single-ended Colpitts oscillator circuit as shown in FIG. 1. Although the phase noise has not been increased, the circuit 20 is generally insensitive to common-mode parasitics and common-mode interferences.

Figure 3:
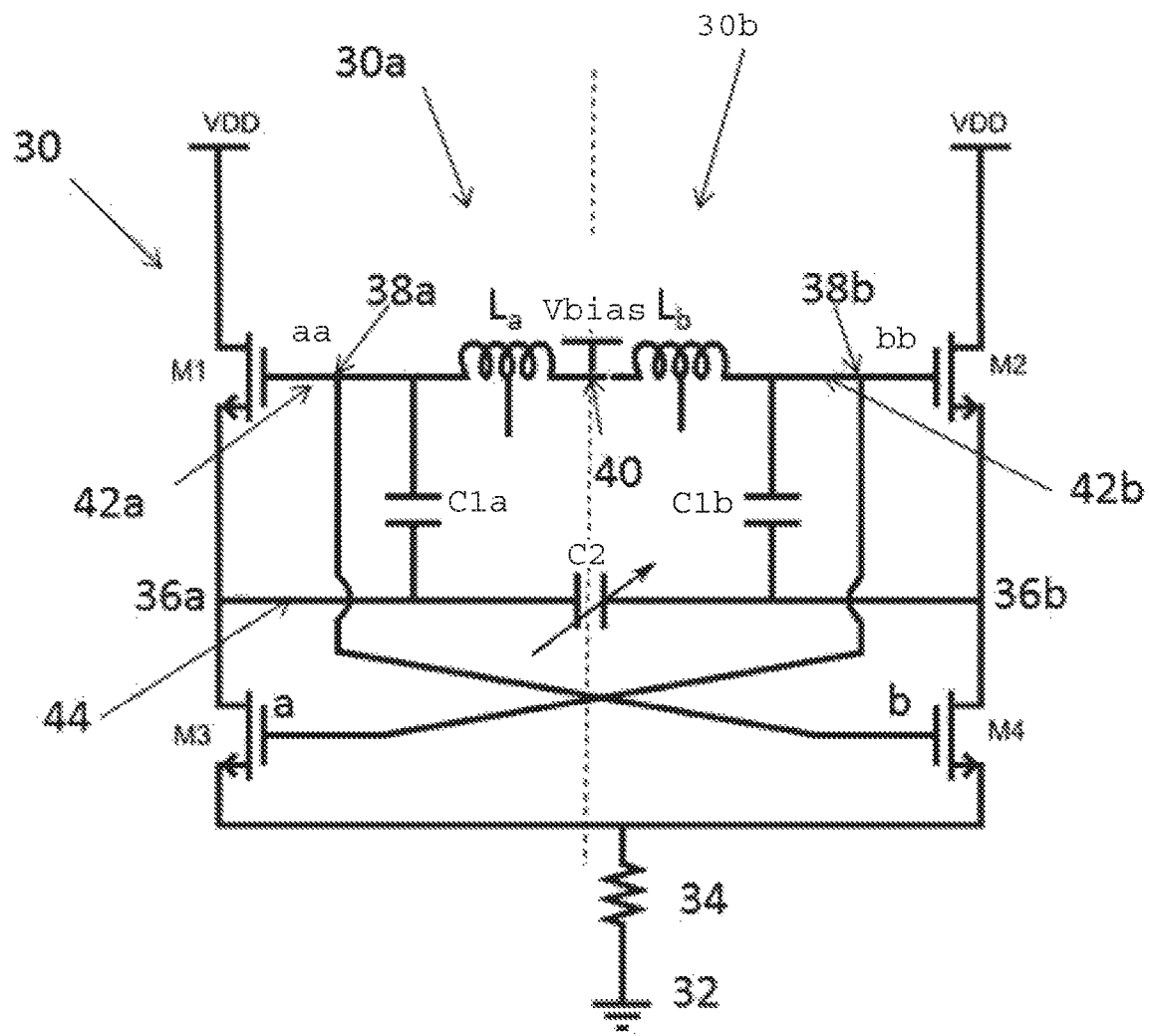
FIG. 3 is a schematic illustration of another conventional differential Colpitts oscillator circuit, according to an example embodiment.

Another conventional differential Colpitts oscillator circuit 30 is shown in FIG. 3. This circuit is similar to that described by Kim et al. as discussed above. As before, the circuit 30 can be considered to comprise two portions 30a, 30b corresponding to two identical single-ended Colpitts oscillators which are joined by a variable or tunable capacitor C2 at tap points 36a, 36b with cross-connections between transistors as described below.

Portion 30*a* comprises transistors M1 and M3 and a capacitor C1*a* connected between line 42*a* extending between a bias voltage node 40 and gate aa of transistor M1 and line 44 joining center-tap points 36*a*, 36*b* containing the variable or tunable capacitor C2. Transistor M1 is connected to voltage supply VDD as shown with transistor M3 connected to ground 32 via resistor 34. Inductor $L_a$ is connected in the line 42*a* between the bias voltage node 40 and gate aa of transistor M1. Gate a of transistor M3 is connected to line 42*b* at tap point 38*b* as shown.

Similarly, portion 30*b* comprises transistors M2 and M4 and a capacitor C1*b* between line 42*b* extending between the bias voltage node 40 and gate bb of transistor M2 and line 44 joining center-tap points 36*a*, 36*b* containing the variable or tunable capacitor C2. Transistor M2 is connected to voltage supply VDD as shown with transistor M4 connected to ground 32 via resistor 34. Inductor $L_b$ connected in the line 42*b* between the bias voltage node 40 and gate bb of transistor M2. Gate b of transistor M4 is connected to line 42*a* at tap point 38*a* as shown.

The tap points 36*a*, 36*b* are located between respective ones of the transistor pairs M1, M3 and M2, M4. The variable or tunable capacitor C2 is connected to a line joining the center-tap points 36*a*, 36*b*.

A differential output is provided by coupling the two portions 30*a*, 30*b* by sharing variable or tunable capacitor C2.

However, by cross-coupling the transistors M3 and M4, it was found that the minimum supply voltage VDD was generally equal to the sum of the drain/source voltage Vds for transistor M1 and the threshold voltage Vth for transistor M3. Typically, the minimum power supply voltage is about 0.7 V. Moreover, transistors M1 and M2 generally need to be large so that they can be fully switched by the bias voltage applied at bias voltage node 40.

The conventional way of realizing the tuning range is to tune the variable or tunable capacitor C2. When the capacitance of C2 increases, the oscillation frequency is reduced as the total capacitance $C_{total}$ increases. The oscillation frequency f can be expressed as:

$$f = \frac{1}{2\pi\sqrt{C_{total}L}}$$

where $$C_{total} = \frac{2C_1C_2}{C_1 + 2C_2}$$

and C1, C2 and L respectively correspond to the capacitance value of C1, the capacitance value of C2 and the inductance of the inductor L.

The feedback voltage V2 can be expressed as:

$$V_2 = \frac{C_1 V_1}{C_1 + 2C_2} \quad (1)$$

where V1 is the power supply voltage VDD, and C1 and C2 are the capacitance values of the capacitors C1 and C2 respectively.

If the feedback voltage V2 decreases below a threshold value, start-up requirements for the oscillator generally cannot be met. The minimum power supply voltage VDD is typically limited by the sum of Vth (from transistor M3) and Vds (from transistor M1). The minimum bias voltage is typically limited by the sum of Vth (from transistor M1), Vth (from transistor M3) and Vds (from the resistor 34).

The limited tuning range can be a significant disadvantage for Colpitts oscillator implementation, and, one problem is how to extend the tuning range without compromising on area, design complexity, and phase noise.

When the capacitance C2 increases, the oscillation frequency and the feedback voltage V2 decrease, and the positive feedback generally cannot sustain the oscillation. One challenge is to maintain the positive feedback voltage while tuning the oscillation frequency.

Figure 4:
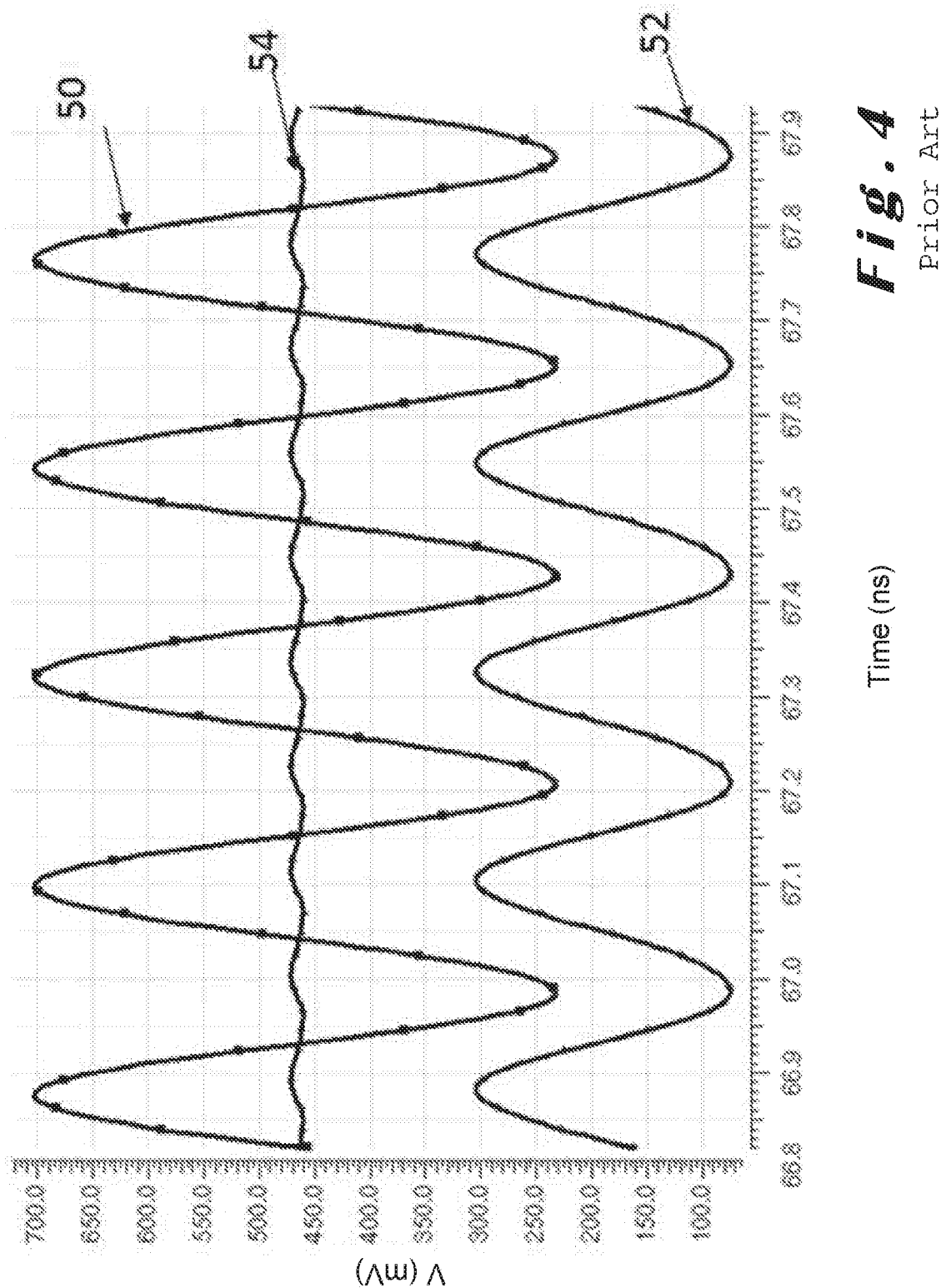
FIG. 4 illustrates voltage swing at gates of transistors M3 and M4 of the circuit shown in FIG. 3, according to an example embodiment.

FIG. 4 illustrates plots of the voltage at gate aa of transistor M1 (line 50), the voltage at gate a of transistor M3 (line 52), and the bias voltage (line 54) applied to the bias node 40 for circuit 30 shown in FIG. 3. It will be appreciated that the voltages are the same for gate bb of transistor M2 and gate a of transistor M4 as transistors M2 and M4 are identical to transistors M1 and M3.

Figure 5:
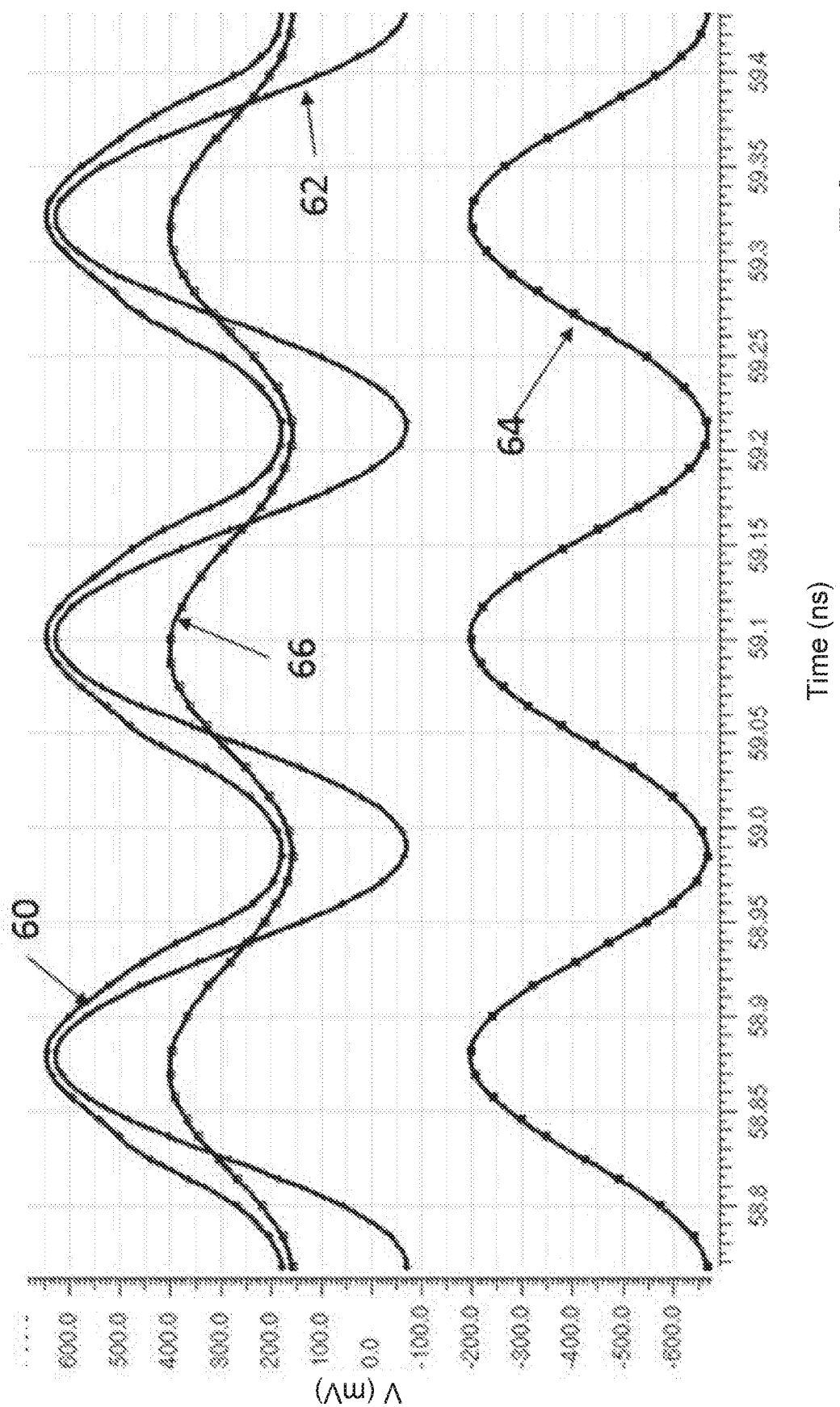
FIG. 5 illustrates voltages across transistors M3 and M4 of the circuit shown in FIG. 3, according to an example embodiment.

FIG. 5 illustrates plots of the transistor voltages for transistors M1 and M3 for the circuit 30 shown in FIG. 3. The transistor voltages for transistors M2 and M4 are identical to respective ones of those for transistors M1 and M3. The gate/source voltage Vgs and the gate/drain voltage Vds for transistor M3 are shown by lines 60 and 62 respectively. The gate/source voltage Vgs and the gate/drain voltage Vgd for transistor M1 are shown by lines 64 and 66 respectively. It can be seen that the Vgs for transistor M3 is twice that of the Vgs for transistor M1 but the Vgd voltages are approximately the same for transistors M1 and M3. As a result of the difference in Vgs for transistors M3 and M1, transistor M3 can easily be damaged by a high voltage swing.

Figure 6:
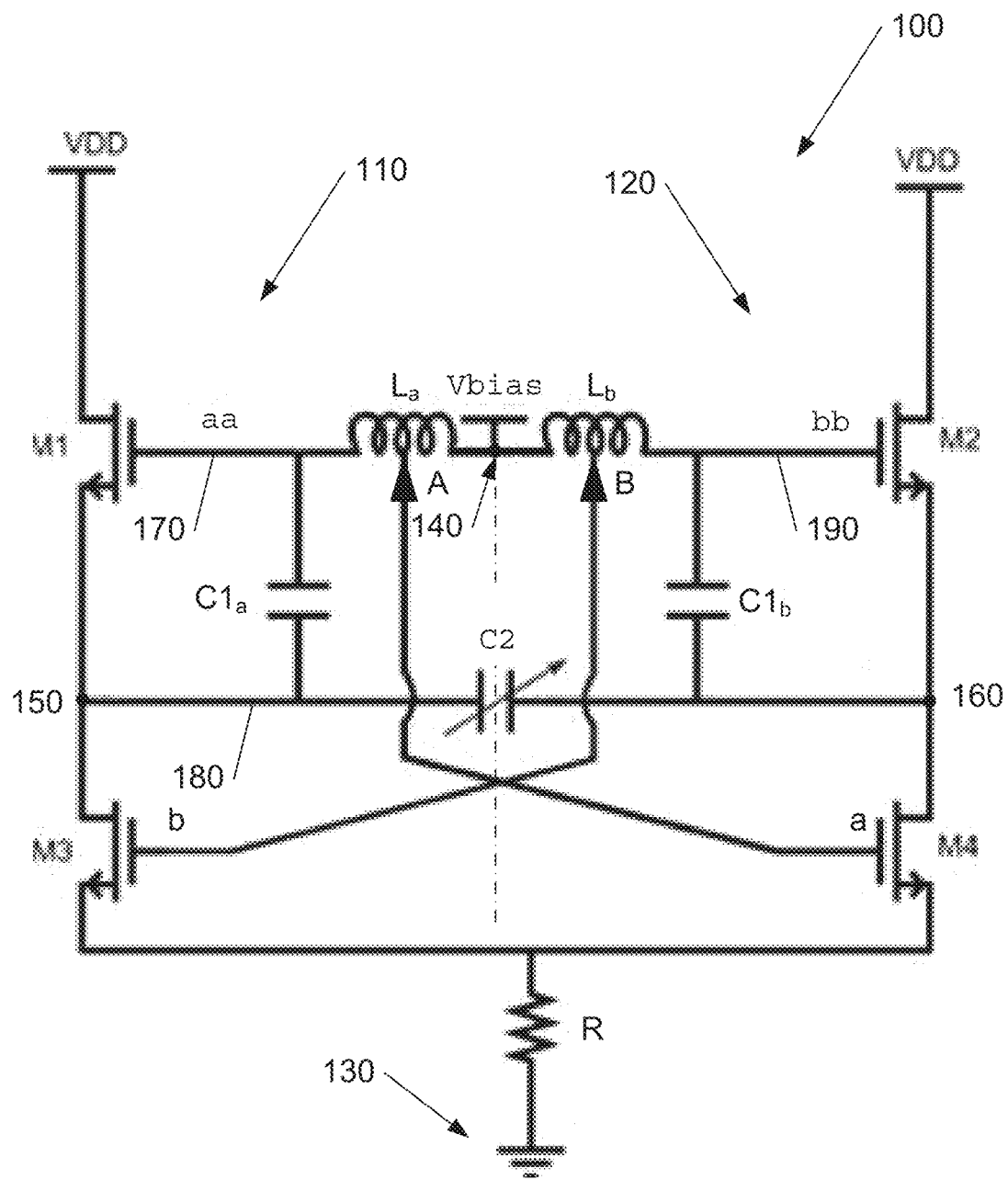
FIG. 6 is a schematic illustration of a differential Colpitts oscillator circuit with low power supply voltage having a low power supply, according to an example embodiment.

A schematic illustration of a differential Colpitts oscillator circuit 100 is shown in FIG. 6 which illustrates how a low power supply voltage may be implemented to address the issues with circuit 30 shown in FIG. 3 and described with reference to FIGS. 4 and 5 above. The circuit 100 is similar to that shown in FIG. 3 and comprises two portions 110, 120. Each portion 110, 120 comprises its own power supply VDD with variable or tunable capacitor C2 being shared therebetween as before. Portion 110 includes transistor M1 and transistor M3 connected in series with a resistor R to ground 130, and inductor $L_a$ connected to gate aa of transistor M1. The inductor $L_a$ is connected between the gate aa of transistor M1 and point 140 to which a bias voltage Vbias can be applied as shown.

Similarly, portion 120 includes transistor M2 and transistor M4 connected in series with the resistor R to ground 130 and inductor $L_b$ connected to gate bb of transistor M2. The inductor $L_b$ is connected between gate bb of transistor M2 and the point 140 to which the bias voltage Vbias can be applied as shown.

Variable or tunable capacitor C2 is connected between each of the transistor pairs M1, M3 and M2, M4 as shown at tap points 150, 160. Capacitor $C1_a$ in portion 110 is connected to line 170 between inductor $L_a$ and gate aa of transistor M1 at one end and to line 180 between tap points 150, 160, including the variable or tunable capacitor C2, at the other end. Similarly, capacitor $C1_b$ in portion 120 is connected to line 190 between inductor $L_b$ and gate bb of transistor M2 at one end and to line 180 between tap points 150, 160 at the other end.

Gate a of transistor M4 is connected to a center-tap point A of the inductor $L_a$ in the other portion 110 of the circuit 100 and gate b of transistor M3 is connected to a center-tap point B of the inductor $L_b$ in the other portion 120 of the circuit 100, that is, the inductors $L_a$, $L_b$ are cross-coupled with the gates a, b of transistors M3, M4 as shown.

Figure 7:
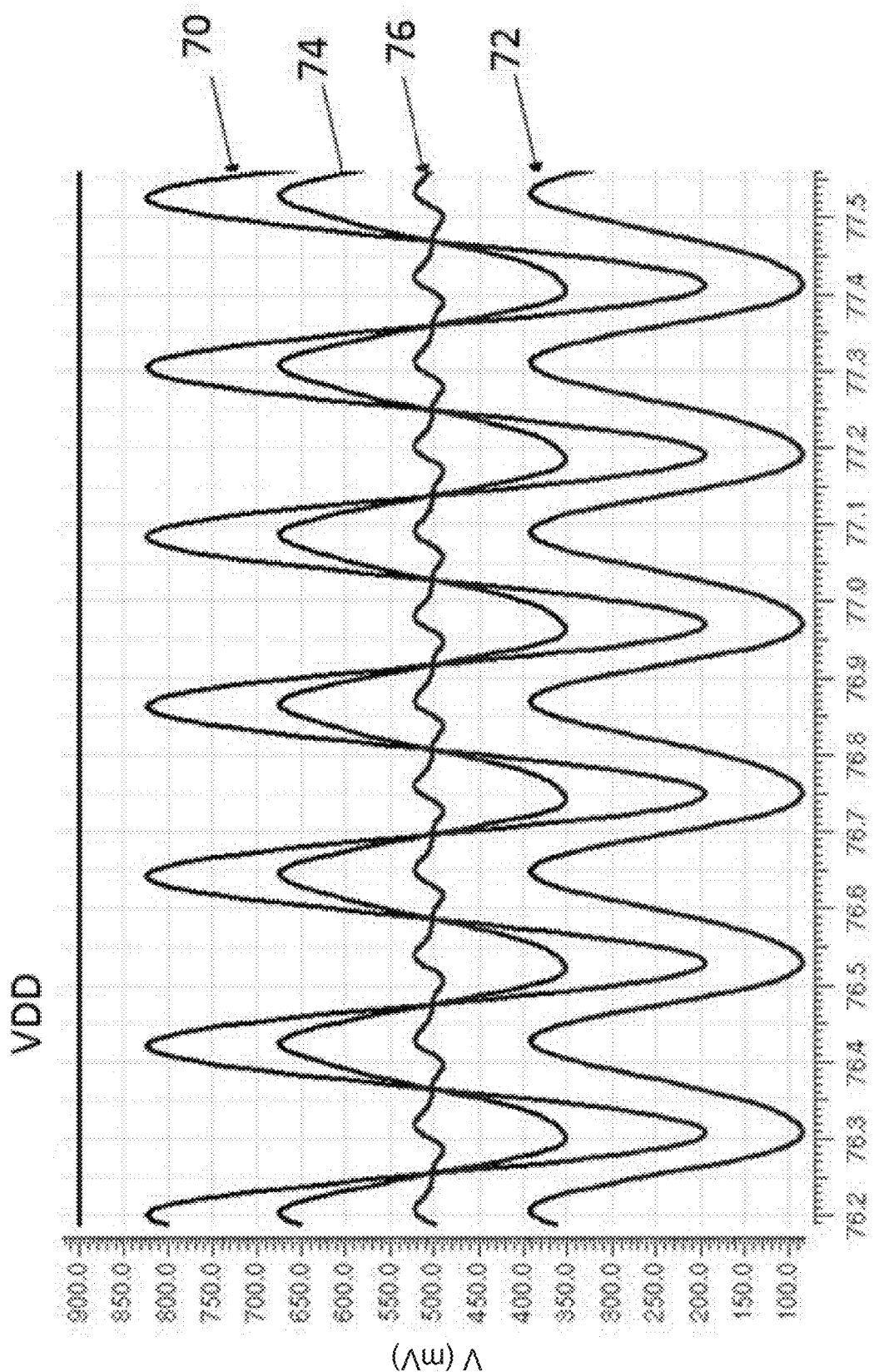
FIG. 7 illustrates voltage swing at gates of transistors for the circuit shown in FIG. 6, according to an example embodiment.
Figure 8:
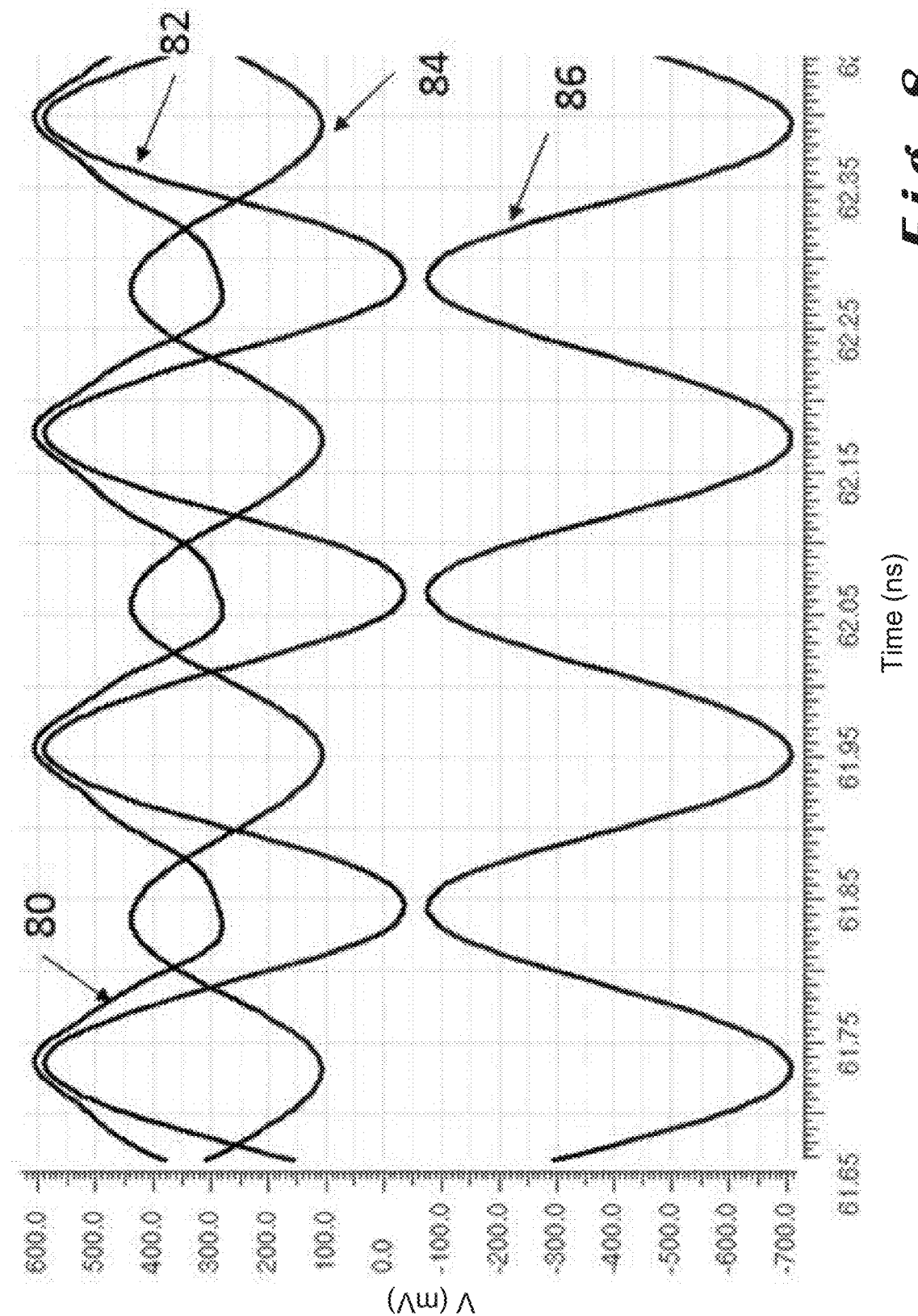
FIG. 8 illustrates voltages across transistors for the circuit shown in FIG. 6, according to an example embodiment.

The potential advantages of having the center-tapped connection to points A and B of respective inductors $L_a$ and $L_b$ are shown in FIGS. 7 and 8.

FIG. 7 is similar to FIG. 4 but illustrates the plots for the voltages at gate aa of transistor M1 (line 70), at gate a of transistor M4 (line 72), at gate b of transistor M3 (line 74) and the bias voltage applied to point 140 (line 76). As will readily be understood, the plots of the voltage at gate bb of transistor M2 will be identical to that shown by line 70.

FIG. 8 is similar to FIG. 5 illustrating the voltages for transistors M1 and M3. As before, the transistor voltages for transistors M2 and M4 are identical to respective ones of those for transistors M1 and M3. The gate/source voltage Vgs and the gate/drain voltage Vds for transistor M3 are shown by lines 80 and 82 respectively. The gate/source voltage Vgs and the gate/drain voltage Vgd for transistor M1 are shown by lines 84 and 86 respectively. It can be seen that both the Vgs and Vgd values for transistor M3 are now similar to those for transistor M1 and transistor M3 will no longer be damaged by high voltage swings. This means that the size of transistors M1 and M3 can be the same thereby saving area.

The minimum bias voltage applied to point 140 is now no longer dependent on threshold voltage Vth and is now determined by the sum of Vds (for transistor M1) and Vds (for transistor M3). This can provide an improvement of around 100 mV to 200 mV. The voltage swing at gates aa, bb of respective transistors M1, M2 is much higher than that at sources of the associated transistors. As a result, the size of the transistors M3, M4 can be reduced, and an improved layout is achieved for the transistors M1, M2, M3, and M4.

Figure 9:
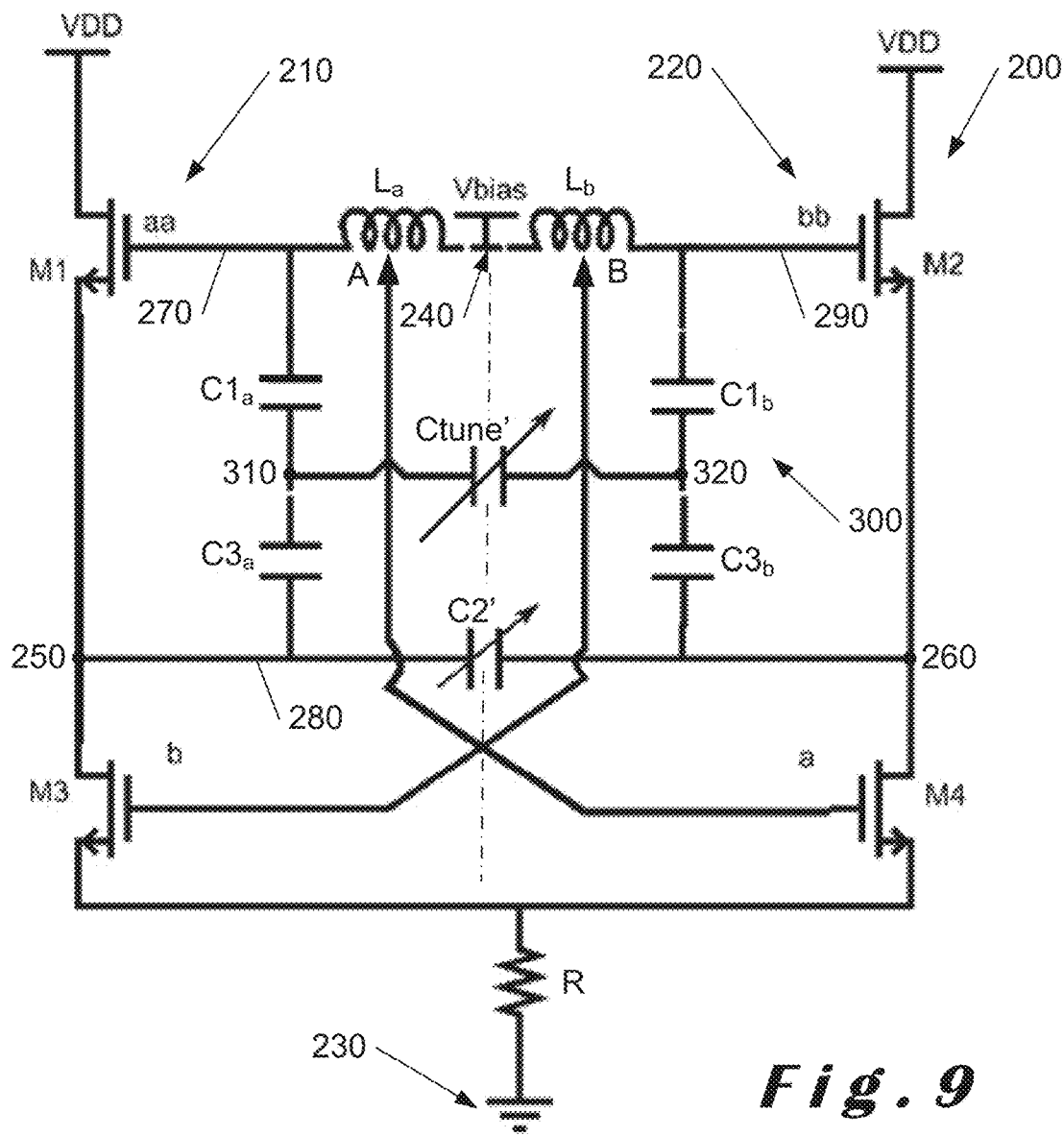
FIG. 9 is a schematic illustration of a differential Colpitts oscillator circuit, according to an example embodiment.

Tuning can be improved using a Colpitts oscillator circuit 200 shown in FIG. 9. The circuit 200 is similar to that shown in FIG. 3 but includes a capacitive ladder or voltage divider 300. As before, the circuit 200 comprises two portions 210, 220 each comprising its own power supply VDD with a variable capacitor C2' shared therebetween as before.

Portion 210 includes transistor M1 and transistor M3 connected in series with a resistor R to ground 230, and inductor $L_a$ connected to gate aa of transistor M1. The inductor $L_a$ is connected between gate aa of transistor M1 and point 240 to which a bias voltage Vbias can be applied as shown.

Similarly, portion 220 includes transistor M2 and transistor M4 connected in series with the resistor R to ground 230 and inductor $L_b$ connected to gate bb of transistor M2. The inductor $L_b$ is connected between gate bb of transistor M2 and the point 240 to which the bias voltage Vbias can be applied as shown.

Gate a of transistor M4 is connected to a center-tap point A of the inductor $L_a$ in the other portion 210 of the circuit 200 and gate b of transistor M3 is connected to a center-tap point B of the inductor $L_b$ in the other portion 220 of the circuit 200, that is, the inductors $L_a$, $L_b$ are cross-coupled with the gates a, b of transistors M3, M4 as shown.

Variable capacitor C2' is connected between each of the transistor pairs M1, M3 and M2, M4 as shown at tap points 250, 260. Instead of having a single capacitor $C1_a$, $C1_b$ in each portion 210, 220 of the circuit 200, the single capacitor $C1_a$, $C1_b$ is replaced by capacitors $C1_a$, $C1_b$ and $C3_a$, $C3_b$ arranged in series between line 270 and line 280 in portion 210 and between line 290 and line 280 in portion 220 as shown.

The capacitive ladder or voltage divider 300 comprises capacitors $C1_a$, $C1_b$ and $C3_a$, $C3_b$ in each of portions 210, 220 and a tunable capacitor Ctune' connected between tap point 310 in portion 210 and tap portion 320 in portion 220 of circuit 200. The capacitance of capacitors $C1_a$, $C1_b$ and $C3_a$, $C3_b$ are C1 and C3 respectively (as capacitors $C1_a$ and $C1_b$ are identical, and, capacitors $C3_a$ and $C3_b$ are identical) with the capacitance of capacitor Ctune' as Ctune/2 and the capacitance of capacitor C2' as C2/2. As there are now two variable or tunable capacitors C2' and Ctune' in parallel, the capacitance value of each capacitor C2' and Ctune' is now halved.

By using the center-tapped configuration of FIG. 6 with the capacitive ladder or voltage divider 300, an increased tuning range can generally be achieved while maintaining a low power supply voltage and protecting the transistors as the threshold voltage Vth is no longer relevant for determining the power supply voltage.

Figure 10:
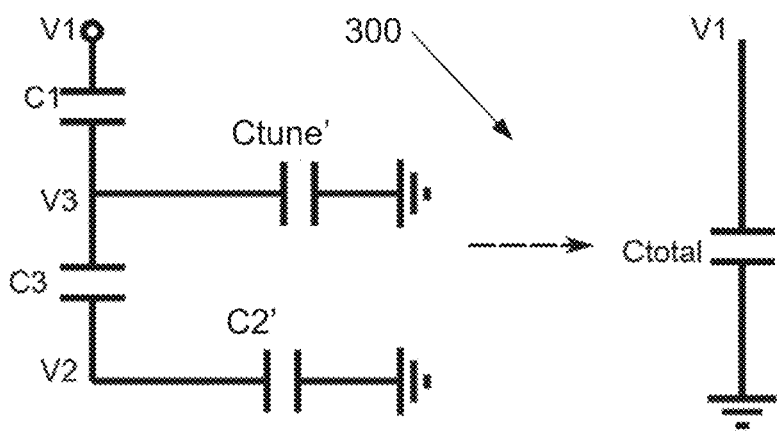
FIG. 10 is a schematic illustration of a single-ended equivalent capacitive ladder or voltage divider forming part of the circuit of FIG. 9, according to an example embodiment.

FIG. 10 illustrates the effect of the capacitive ladder or voltage divider 300 where the effective capacitance thereof is Ctotal. Only one end of the capacitive ladder is shown which, with the other end, provides a total effective capacitance of Ctotal.

In contrast to FIG. 6, the capacitive voltage divider 300 of FIG. 9 provides positive feedback for the circuit 200.

The total equivalent capacitance Ctotal of the capacitive voltage divider 300 can be expressed as:

$$Ctotal = \frac{C_1 C_2 C_3}{C_1 C_2 + C_1 C_3 + C_2 C_3 + C_2 C_{tune} + C_3 C_{tune}} + \frac{C_1 C_2 C_{tune}}{C_1 C_2 + C_1 C_3 + C_2 C_3 + C_2 C_{tune} + C_3 C_{tune}} + \frac{C_1 C_3 C_{tune}}{C_1 C_2 + C_1 C_3 + C_2 C_3 + C_2 C_{tune} + C_3 C_{tune}} \quad (2)$$

As can be seen from equation (2), the capacitance values C2 and Ctune have equal impact on the total capacitance Ctotal. In equation (2) above, C2 and Ctune correspond to C2' and Ctune' respectively as shown in FIG. 9.

The positive feedback voltage can be calculated as:

$$V_2 = \frac{C_1 C_3 V_1}{C_1 C_2 + C_1 C_3 + C_2 C_3 + C_2 C_{tune} + C_3 C_{tune}}$$

with the denominator being simplified to:

$$(C_1+C_3)C_2 + C_1 C_3 + C_2 C_{tune} + C_3 C_{tune} \quad (3)$$

where the capacitance C2 has the coefficient of the sum of capacitances C1+C3 and the capacitance Ctune has the coefficient of the capacitance C3 where C2 and Ctune in equation (3) correspond to C2' and Ctune' respectively as shown in FIG. 9. This means that the capacitance Ctune' has less impact on the feedback voltage. When comparing whether C2' and Ctune' should be tuned to determine which one would be more effective, for example, if C2' is tuned 10% more, then the denominator as expressed in equation (3) would become $$(C_1+C_3)(C_2*1.1) + C_1 C_3 + (C_2*1.1)C_{tune} + C_3 C_{tune}$$

and, if, Ctune' is tuned 10% more, then the denominator as expressed in equation (3) would become $$(C_1+C_3)C_2 + C_1 C_3 + C_2(C_{tune}*1.1) + C_3(C_{tune}*1.1)$$

As a result, positive feedback voltage changes when Ctune' is tuned are smaller than those when C2' is tuned.

Although the capacitor C2' is a variable capacitor, it is proposed to use only capacitor Ctune' to effect the frequency tuning; but fine-tuning of the oscillator circuit can be achieved by tuning capacitor C2'.

The term "fine-tuning" as used herein refers to making small precise adjustments in order to achieve the best or desired performance. This is in contrast to the term "tuning" which provides larger less precise adjustments.

Cadence simulations have been performed to verify the improvement of the tuning for the differential Colpitts oscillator circuit 200 as shown in FIG. 9. Identical cadence simulations have also been performed using a conventional differential Colpitts oscillator circuit 30 as shown in FIG. 3. The circuit 30 shown in FIG. 3 is similar to that shown in FIG. 9 but without the capacitive ladder or voltage divider 300 and center-tapped inductors.

Cadence simulations indicated that the circuit 200 (FIG. 4) has improved phase noise performance at low frequencies. Table 1 illustrates the results of a simulation showing a comparison between a conventional tuning scheme and the tuning scheme of the present disclosure (proposed tuning scheme).

TABLE 1

|  | conventional tuning scheme |  | proposed tuning scheme |  |  |
|---|---|---|---|---|---|
| C1 (pf) | 4.2 | 4.2 | 3.0 | 3.0 | 3.0 |
| C2 (pf) | 0.2 | 0.2 | 0.2 | 0.2 | 0.2 |
| C3 (pf) | 1.0 | 1.0 | 1.0 | 1.0 | 1.0 |
| Ctotal (pf) | 0.25 | 1.0 | 0.25 | 0.465 | 1.0 |
| PN@1 MHz | −115.8 | −115.7 | −115.2 | −115.4 | −112.6 |
| PN@10 kHz | −66.5 | −65.9 | −69.2 | −66.3 | −59.6 |
| $I_{supply}$ (µA) | 926 | 1270 | 899 | 1020 | 1200 |
| $f_0$ (GHz) | 4.51 | 4.12 | 4.54 | 4.12 | 3.60 |
| Tuning range | 3.98% |  | 11.5% |  |  |

As shown, the tuning range has been extended from 3.98% to 11.5% for the differential Colpitts oscillator circuit as shown in FIG. 9.

Figure 11:
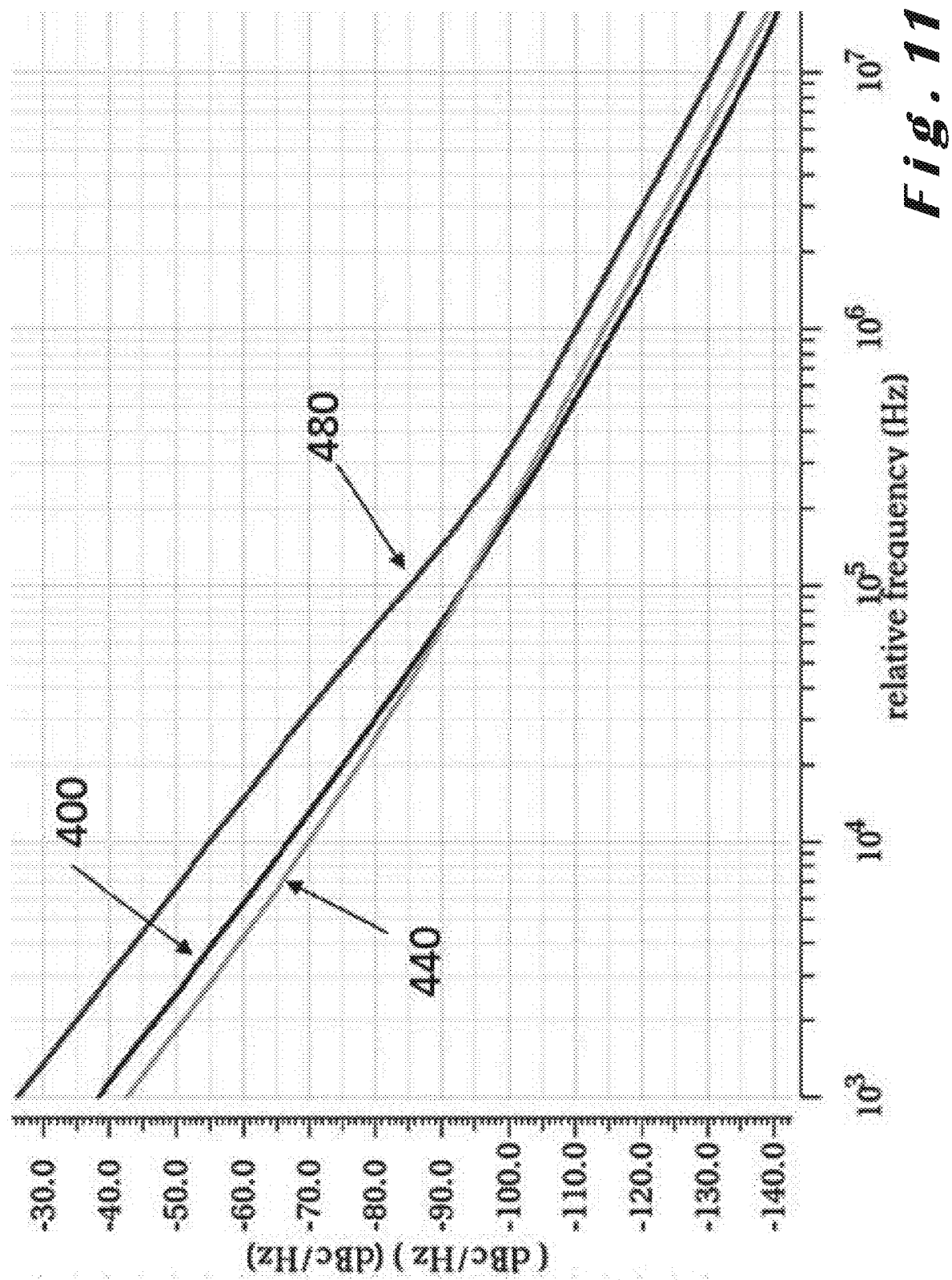
FIG. 11 illustrates a comparison in the performance of circuits shown in FIGS. 2, 3 and 7 in a cadence simulation, according to an example embodiment.

In FIG. 11, the results obtained for phase noise from the simulations for circuit 30 of FIG. 3 is indicated by line 400 and the circuit 200 of FIG. 9 by line 440. Additionally, for comparison, the results for a differential Colpitts oscillator circuit without noise shifting is shown by line 480.

In effect, it was found that tuning capacitor Ctune' instead of C2' provides a larger tuning range for the oscillator circuit with better phase noise and less power consumption.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A circuit comprising:
   a first transistor and a second transistor;
   a first inductor connected in a first line between a first gate of the first transistor and a connecting point;
   a third transistor and a fourth transistor;
   a second inductor connected in a second line between a second gate of the third transistor and the connecting point;
   a first pair of capacitors connected between the first gate and a first source of the first transistor;
   a second pair of capacitors connected between the second gate and a second source of the third transistor; and
   a variable capacitor connected to the first pair of capacitors and the second pair of capacitors,
   wherein a fourth gate of the fourth transistor is connected to a first center-tap point of the first inductor and a third gate of the second transistor is connected to a second center-tap point of the second inductor.

2. The circuit according to claim 1, the variable capacitor being adjustable to adjust a tuning range of the circuit.

3. A circuit comprising:
   a first transistor comprising a first terminal and a second terminal that is a gate terminal;
   a second transistor comprising a third terminal and a fourth terminal;
   a third transistor comprising a fifth terminal and a sixth terminal that is a gate terminal;
   a fourth transistor comprising a seventh terminal and an eighth terminal;
   a first inductor comprising a ninth terminal and a tenth terminal;
   a second inductor comprising an eleventh terminal and a twelfth terminal;
   a resistor comprising a thirteenth terminal; and
   a capacitive ladder comprising a fourteenth terminal, a fifteenth terminal, a sixteenth terminal, and a seventeenth terminal,
   wherein the second terminal, the fifteenth terminal, and the ninth terminal form a first node,
   wherein the tenth terminal and the eleventh terminal form a second node,
   wherein the twelfth terminal, the seventeenth terminal, and the sixth terminal form a third node,
   wherein the first terminal, the fourteenth terminal, and the third terminal form a fourth node,
   wherein the fifth terminal, the sixteenth terminal, and the seventh terminal form a fifth node, and
   wherein the fourth terminal, the eighth terminal, and the thirteenth terminal form a sixth node,
   wherein the capacitive ladder comprises:
   a first capacitor comprising an eighteenth terminal;
   a second capacitor comprising a nineteenth terminal;
   a third variable capacitor comprising a twentieth terminal and a twenty-first terminal;
   a fourth capacitor comprising a twenty-second terminal; and
   a fifth capacitor comprising a twenty-third terminal,
   wherein the eighteenth terminal, the nineteenth terminal, and the twentieth terminal form a seventh node, and
   wherein the twenty-first terminal, the twenty-second terminal, and the twenty-third terminal form an eighth node.

4. The circuit according to claim 3, further comprising a sixth variable capacitor comprising a twenty-fourth terminal and a twenty-fifth terminal, wherein the twenty-fourth terminal additionally forms the fourth node, and wherein the twenty-fifth terminal additionally forms the fifth node.

5. The circuit according to claim 4,
   wherein the first inductor further comprises a first center-tap terminal, wherein the second inductor further comprises a second center-tap terminal, wherein the second transistor further comprises a twenty-sixth terminal that is a gate terminal, wherein the fourth transistor further comprises a twenty-seventh terminal that is a gate terminal, wherein the twenty-seventh terminal and the first center-tap terminal form a ninth node, and wherein the twenty-sixth terminal and the second center-tap terminal form a tenth node.

6. The circuit according to claim 5, wherein the sixth variable capacitor is adjustable to adjust a tuning range of the circuit.

7. The circuit according to claim 5, wherein the third variable capacitor is adjustable to adjust a tuning range of the circuit.

* * * * *